(12) United States Patent
Kiyohara

(10) Patent No.: US 9,306,580 B2
(45) Date of Patent: Apr. 5, 2016

(54) OSCILLATION CIRCUIT, OSCILLATOR, ELECTRONIC DEVICE, MOBILE OBJECT, AND OSCILLATOR MANUFACTURING METHOD

(71) Applicant: Seiko Epson Corporation, Tokyo (JP)

(72) Inventor: Atsushi Kiyohara, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/533,477

(22) Filed: Nov. 5, 2014

(65) Prior Publication Data

US 2015/0123743 A1   May 7, 2015

(30) Foreign Application Priority Data

Nov. 7, 2013   (JP) .................................. 2013-231420

(51) Int. Cl.
*H03B 5/04* (2006.01)
*H03L 7/00* (2006.01)
*H03B 5/36* (2006.01)

(52) U.S. Cl.
CPC .. *H03L 7/00* (2013.01); *H03B 5/04* (2013.01); *H03B 5/362* (2013.01); *H03B 5/368* (2013.01)

(58) Field of Classification Search
CPC ............... H03B 2200/0012; H03B 2200/0026; H03B 2200/004
USPC ............................................ 331/36 C, 177 V
See application file for complete search history.

(56) References Cited

U.S. PATENT DOCUMENTS

| 6,788,159 | B2 * | 9/2004 | Takahashi et al. ............ 331/176 |
| 7,808,333 | B2 | 10/2010 | Takeuchi et al. |
| 7,821,348 | B2 | 10/2010 | Ishimaru et al. |
| 7,847,640 | B2 | 12/2010 | Kiyohara |
| 7,911,285 | B2 * | 3/2011 | Terada et al. ................. 331/158 |

FOREIGN PATENT DOCUMENTS

| JP | 2000-196359 A | 7/2000 |
| JP | 2005-303388 A | 10/2005 |
| JP | 2006-025336 A | 1/2006 |
| JP | 2007-096523 A | 4/2007 |
| JP | 2008-187578 A | 8/2008 |
| JP | 2008-211763 A | 9/2008 |
| JP | 2008-289139 A | 11/2008 |
| JP | 2009-044606 A | 2/2009 |
| JP | 2009-201097 A | 9/2009 |
| JP | 2010-161532 A | 7/2010 |
| JP | 2012-222575 A | 11/2012 |
| JP | 2013-141068 A | 7/2013 |

* cited by examiner

*Primary Examiner* — Joseph Chang
(74) *Attorney, Agent, or Firm* — Harness, Dickey & Pierce, P.L.C.

(57) ABSTRACT

An oscillation circuit includes a circuit for frequency adjustment, a variable capacity control circuit in which a voltage to be output therefrom is controlled with either a voltage which is input from a terminal T1 or a voltage other than the voltage which is input from the terminal T1, a circuit for oscillation which is provided with a varactor and to which a signal from the circuit for frequency adjustment and a signal from the variable capacity control circuit are input, and a three-terminal switch which outputs the voltage which is input from the terminal T1 to either the circuit for frequency adjustment or the variable capacity control circuit.

19 Claims, 11 Drawing Sheets

OSCILLATION CIRCUIT, OSCILLATOR, ELECTRONIC DEVICE, MOBILE OBJECT, AND OSCILLATOR MANUFACTURING METHOD

BACKGROUND

1. Technical Field

The present invention relates to an oscillation circuit, an oscillator, an electronic device, a mobile object, and an oscillator manufacturing method.

2. Related Art

Various oscillators using a resonator (piezoelectric resonator) such as a crystal resonator or micro-electro-mechanical systems (MEMS) have been developed. Since there have been many requests for reducing the size of oscillators in recent years, oscillators having a minimum number of terminals exist. For example, there is a voltage-controlled temperature-compensated crystal oscillator (VC-TCXO) having only four terminals, i.e., a power terminal, a voltage control terminal (VC terminal), an output terminal, and a ground terminal. In such an oscillator having a small number of terminals, a dedicated terminal for inspection or adjustment cannot be provided.

JP-A-2009-201097 discloses a crystal oscillator which can be reduced in size by also using an inspection terminal of a crystal resonator as another terminal.

In the above-described voltage-controlled temperature-compensated crystal oscillator (VC-TCXO) with four terminals, when a terminal for adjusting temperature compensation characteristics is used also as a control terminal to adjust the temperature compensation characteristics, this control terminal is connected to, for example, an automatic frequency control (AFC) circuit during normal operation, and is connected to a temperature compensation circuit in adjusting the temperature compensation characteristics. Accordingly, during normal operation, a voltage according to an input voltage of the control terminal is applied, via the AFC circuit, to a variable capacity element for frequency control which is provided in an oscillation circuit. However, in adjusting the temperature compensation characteristics, the control terminal and the AFC circuit are disconnected from each other, and thus the voltage according to the input voltage of the control terminal is not applied. Therefore, in adjusting the temperature compensation characteristics, the temperature compensation characteristics are adjusted in a state in which the variable capacity element for frequency control has a capacity value different from that during normal operation. Accordingly, even when temperature compensation is correctly performed during normal operation, the load capacity of the oscillation circuit varies, and thus there is a concern that the oscillation circuit may have deteriorated frequency accuracy.

SUMMARY

An advantage of some aspects of the invention is to provide an oscillation circuit, an oscillator, an electronic device, a mobile object, and an oscillator manufacturing method capable of reducing deterioration in frequency accuracy.

The invention can be implemented as the following forms or application examples.

Application Example 1

This application example is directed to an oscillation circuit including: a frequency controller; a capacity controller which can variably set a voltage to be output therefrom; an oscillation unit which has a capacity variation unit and to which a voltage from the frequency controller and a voltage from the capacity controller are input; and a first selection unit to which a voltage from a voltage application unit is input and which selects whether or not to output the voltage from the voltage application unit to the capacity controller, in which the capacity controller is controlled based on either the voltage from the voltage application unit or a voltage other than the voltage from the voltage application unit.

According to the oscillation circuit of this application example, the first selection unit selects whether or not to output the voltage from the voltage application unit to the capacity controller. Furthermore, the voltage which is output from the capacity controller when the voltage from the voltage application unit is not output to the capacity controller by the first selection unit is controlled with the voltage other than the voltage from the voltage application unit so as to approach a voltage which is output from the capacity controller when the voltage from the voltage application unit is output to the capacity controller by the first selection unit. Furthermore, deterioration in frequency accuracy can be reduced by adjusting the frequency which is controlled by the frequency controller in the above-described state.

Application Example 2

This application example is directed to an oscillation circuit including: a first terminal; a circuit for oscillation which is provided with a variable capacity element; a circuit for frequency adjustment which is electrically connected to the circuit for oscillation; a variable capacity control circuit which is electrically connected to one terminal of the variable capacity element; and a first switching portion which controls the electrical connection between the first terminal and the variable capacity control circuit, in which a voltage which is output from the variable capacity control circuit is controlled based on either a voltage which is input from the first terminal or a voltage other than the voltage which is input from the first terminal.

The circuit for oscillation may be apart of various oscillation circuits such as a Pierce oscillation circuit, an inverter oscillation circuit, a Colpitts oscillation circuit, or a Hartley oscillation circuit.

According to the oscillation circuit of this application example, the first switching portion switches whether or not to electrically connect the first terminal and the variable capacity control circuit to each other. Furthermore, the voltage which is output from the variable capacity control circuit when the first terminal and the variable capacity control circuit are not electrically connected to each other is controlled with the voltage other than the voltage which is input from the first terminal so as to approach a voltage which is output from the variable capacity control circuit when the first terminal and the variable capacity control circuit are electrically connected to each other. Furthermore, deterioration in frequency accuracy can be reduced by, for example, adjusting the circuit for oscillation in the above-described state.

Application Example 3

In the oscillation circuit according to the application example described above, the first switching portion may be controlled so as to cut the electrical connection between the first terminal and the variable capacity control circuit, and in the variable capacity control circuit, the voltage which is output therefrom may be controlled with the voltage other than the voltage which is input from the first terminal.

According to the oscillation circuit of this application example, since the first switching portion is controlled so as to cut the electrical connection between the first terminal and the variable capacity control circuit, the voltage from the first terminal is not applied to the variable capacity control circuit. Therefore, in the variable capacity control circuit, the voltage which is output from the variable capacity control circuit is controlled with the voltage other than the voltage from the first terminal without being influenced by the voltage from the first terminal. Accordingly, in a state in which the voltage which is output from the variable capacity control circuit is set to approach a voltage which is output from the variable capacity control circuit when the first terminal and the variable capacity control circuit are electrically connected to each other, the oscillation circuit is adjusted, and thus deterioration in frequency accuracy can be reduced.

Application Example 4

In the oscillation circuit according to the application example described above, the first switching portion may be controlled so that the first terminal and either the circuit for frequency adjustment or the variable capacity control circuit are electrically connected to each other.

According to the oscillation circuit of this application example, in a state in which the first terminal and the circuit for frequency adjustment are electrically connected to each other using the first switching portion, and the voltage which is output from the variable capacity control circuit is set so as to approach a voltage which is output from the variable capacity control circuit when the first terminal and the variable capacity control circuit are electrically connected to each other, temperature compensation characteristics are adjusted using the circuit for frequency adjustment, e.g., a temperature compensation circuit or the like, and thus deterioration in frequency accuracy can be reduced.

Application Example 5

In the oscillation circuit according to the application example described above, the variable capacity control circuit may be provided with an AFC circuit, a voltage generation circuit which can variably set a voltage to be output therefrom, and a second switching portion which controls the electrical connection between the AFC circuit and the voltage generation circuit.

According to the oscillation circuit of this application example, in a state in which the AFC circuit and the voltage generation circuit are electrically connected to each other using the second switching portion, and the voltage which is output from the voltage generation circuit is set so as to approach a voltage which is input to the AFC circuit when the first terminal and the AFC circuit are electrically connected to each other, temperature compensation characteristics are adjusted using the circuit for frequency adjustment, e.g., a temperature compensation circuit, and thus deterioration in frequency accuracy can be reduced.

Application Example 6

In the oscillation circuit according to the application example described above, the variable capacity control circuit may be provided with an AFC circuit, a voltage generation circuit which can variably set a voltage to be output therefrom, and a second switching portion which controls the electrical connection between the one terminal of the variable capacity element and either the AFC circuit or the voltage generation circuit.

According to the oscillation circuit of this application example, in a state in which the AFC circuit and the one terminal of the variable capacity element are electrically connected to each other using the second switching portion, and the voltage which is output from the voltage generation circuit is set so as to approach a voltage which is output from the AFC circuit when the first terminal and the AFC circuit are electrically connected to each other, temperature compensation characteristics are adjusted using the circuit for frequency adjustment, e.g., a temperature compensation circuit, and thus deterioration in frequency accuracy can be reduced.

Application Examples 7, 8, and 9

The oscillation circuit according to the application example described above may further include: a memory in which data for controlling the voltage which is output from the variable capacity control circuit is stored.

According to the oscillation circuit of these application examples, the data for controlling the variable capacity control circuit can be stored and freely changed.

Application Examples 10 and 11

The oscillation circuit according to the application example described above may further include: a memory in which data for controlling the voltage which is output from the variable capacity control circuit is stored, and in the memory, first data for controlling the AFC circuit and second data for controlling the voltage generation circuit may be stored to use a storage region where the first data and the second data are stored in common.

According to the oscillation circuit of these application examples, the data for controlling the AFC circuit and the data for controlling the voltage generation circuit are stored at the same address in the same memory. Therefore, the data for controlling the variable capacity circuit can be stored with a small memory capacity.

Application Examples 12 and 13

In the oscillation circuit according to the application example described above, the data for controlling the variable capacity control circuit may be composed of three or more bits.

According to the oscillation circuit of these application examples, the data for controlling the variable capacity control circuit is composed of three or more bits, and thus the voltage which is output from the variable capacity control circuit can be precisely set. Accordingly, the voltage which is output from the voltage generation circuit can be set so as to approach a voltage which is output from the variable capacity control circuit when the first terminal and the variable capacity control circuit are electrically connected to each other, and thus when temperature compensation characteristics are adjusted using the circuit for frequency adjustment, e.g., a temperature compensation circuit, further deterioration in frequency accuracy can be reduced.

Application Example 14

This application example is directed to an oscillator including: the oscillation circuit according to any one of the application examples; and a resonator.

Application Example 15

This application example is directed to an electronic device including: the oscillation circuit according to any one of the application examples or the oscillator according to the application example.

Application Example 16

This application example is directed to a mobile object including: the oscillation circuit according to any one of the application examples or the oscillator according to the application example.

According to the electronic device and the mobile object of these application examples, since deterioration in frequency accuracy of the oscillation circuit or the oscillator can be reduced, an electronic device and a mobile object having higher reliability can be realized.

Application Example 17

This application example is directed to an oscillator manufacturing method including: preparing a resonator and an oscillation circuit including a first terminal, a circuit for oscillation which is provided with a variable capacity element, a circuit for frequency adjustment which is electrically connected to the circuit for oscillation, a variable capacity control circuit which is electrically connected to one terminal of the variable capacity element, and a first switching portion which controls the electrical connection between the first terminal and the variable capacity control circuit, a voltage which is output from the variable capacity control circuit being controlled based on either a voltage which is input from the first terminal or a voltage other than the voltage which is input from the first terminal; electrically connecting the oscillation circuit and the resonator to each other; controlling the first switching portion so as to electrically disconnect the first terminal and the variable capacity control circuit from each other, and controlling the voltage which is output from the variable capacity control circuit with the voltage other than the voltage which is input from the first terminal; and examining characteristics of the oscillation circuit.

According to the oscillator manufacturing method of this application example, in a state in which the first terminal and the variable capacity control circuit are electrically disconnected from each other, and the voltage which is output from the variable capacity control circuit is controlled with the voltage other than the voltage which is input from the first terminal, characteristics of the oscillation circuit, e.g., characteristics of a temperature compensation circuit are examined, and thus the adjustment of temperature compensation characteristics by the temperature compensation circuit can be performed with high accuracy. Accordingly, an oscillator in which deterioration in frequency accuracy is reduced can be manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described using the drawings. Embodiments to be described below do not unreasonably limit the content of the invention described in the aspects. All of the configurations to be described below are not necessarily essential constituent elements of the invention.

1. Oscillator 1-1. First Embodiment

Configuration of Oscillator

Figure 1:
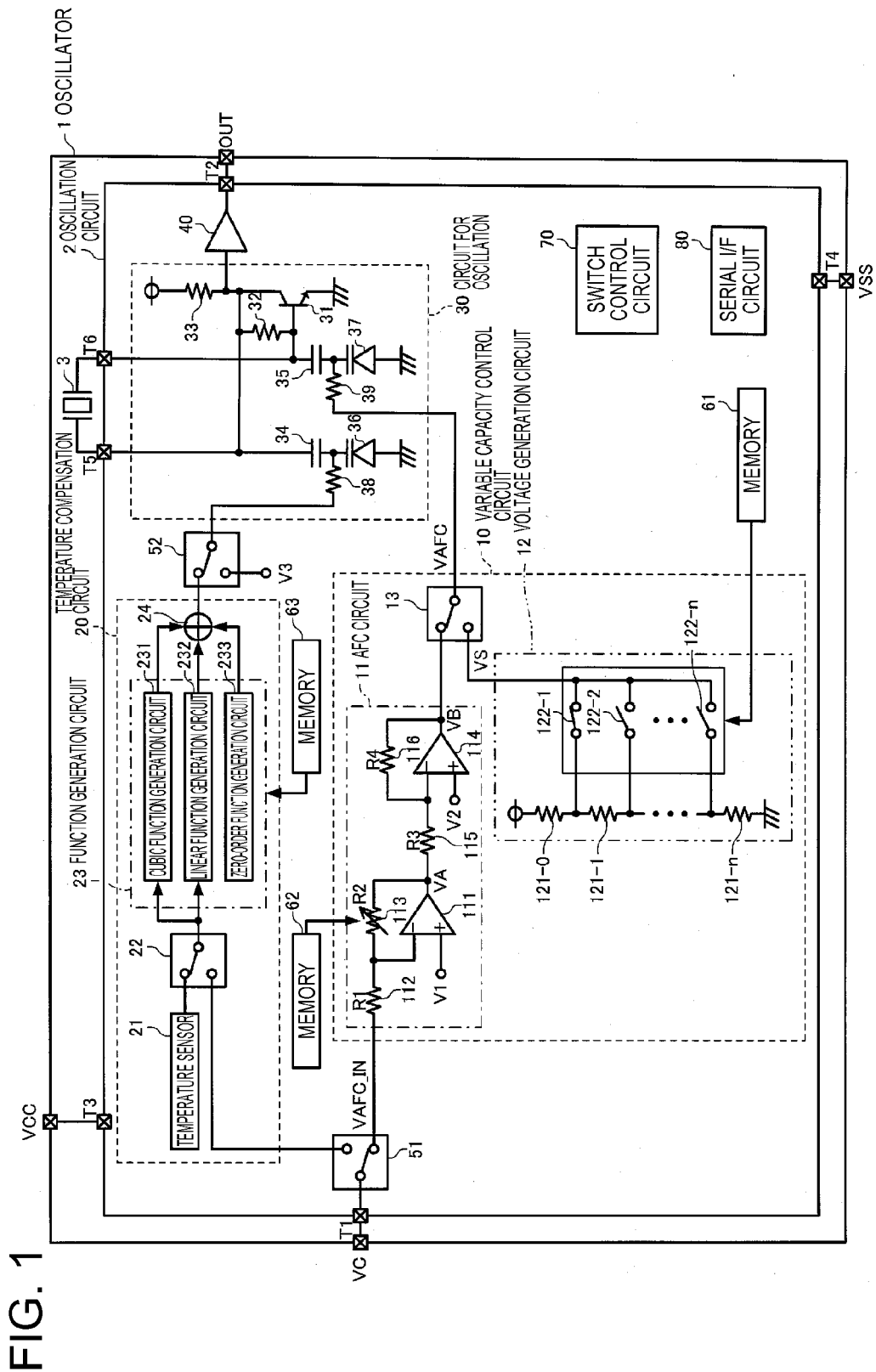
FIG. 1 is a functional block diagram of an oscillator of a first embodiment.

FIG. 1 is a functional block diagram of an oscillator of a first embodiment. As shown in FIG. 1, an oscillator 1 of the first embodiment includes an oscillation circuit 2 and a resonator 3, and the oscillation circuit 2 and the resonator 3 are accommodated in a package (not shown).

The oscillator 1 of this embodiment is a voltage-controlled temperature-compensated oscillator, and is provided with four external terminals, i.e., a VCC terminal which is a power terminal, a VSS terminal which is a ground terminal, a VC terminal which is a control terminal, and an OUT terminal which is an output terminal. The VCC terminal is supplied with a power supply voltage (an example of the voltage other than the voltage which is input from the first terminal), and the VSS Terminal is grounded. A frequency control signal is input to the VC terminal, and from the OUT terminal, a temperature-compensated oscillation signal of a frequency according to the voltage of the VC terminal is output.

In this embodiment, the resonator 3 is a crystal resonator using crystal as a substrate material, and for example, an AT-cut or SC-cut crystal resonator is used. The resonator 3 may be a surface acoustic wave (SAW) resonator or a micro-electro-mechanical systems (MEMS) resonator. Other than crystal, a piezoelectric material such as piezoelectric single crystal e.g., lithium tantalite and lithium niobate and piezoelectric ceramics e.g., lead zirconate titanate, or a silicon semiconductor material can be used as the substrate material of the resonator 3. As an exciter of the resonator 3, an exciter using a piezoelectric effect may be used, or electrostatic drive using Coulomb force may be used.

The oscillation circuit 2 has six terminals T1 to T6. The terminal T1 (an example of "unit which applies a voltage from outside" and "first terminal") is connected to the VC terminal which is an external terminal, the terminal T2 is connected to the OUT terminal which is an external terminal, the terminal T3 is connected to the VCC terminal which is an external terminal, and the terminal T4 is connected to the VSS terminal which is an external terminal. In addition, the terminal T5 is connected to one terminal of the resonator 3, and the terminal T6 is connected to the other terminal of the resonator 3.

In this embodiment, the oscillation circuit 2 includes a variable capacity control circuit 10 (an example of "capacity controller"), a temperature compensation circuit (an example of "frequency controller" and "circuit for frequency adjustment"), a circuit 30 for oscillation (an example "oscillation unit"), an output buffer 40, a three-terminal switch 51 (an example "first selection unit" and "first switching portion"), a three-terminal switch 52, a memory 61, a memory 62, a memory 63, a switch control circuit 70, and an interface (I/F) circuit 80. The oscillation circuit 2 of this embodiment may have a configuration in which some of these elements are omitted or changed, or other elements are added.

The variable capacity control circuit 10 includes an AFC circuit 11, a voltage generation circuit (voltage selection circuit) 12, and a three-terminal switch 13.

The AFC circuit 11 includes a calculation amplifier 111, a resistance 112 having a resistance value R1, a variable resistance 113 having a resistance value R2, a calculation amplifier 114, a resistance 115 having a resistance value R3, and a resistance 116 having a resistance value R4.

The resistance 112 is connected between a third terminal of the three-terminal switch 51 and an inversion input terminal (minus terminal) of the calculation amplifier 111, and the variable resistance 113 is connected between the inversion input terminal (minus terminal) and an output terminal of the calculation amplifier 111. A constant voltage V1 is input to a non-inversion input terminal (plus terminal) of the calculation amplifier 111.

The resistance 115 is connected between the output terminal of the calculation amplifier 111 and an inversion input terminal (minus terminal) of the calculation amplifier 114, and the resistance 116 is connected between the inversion input terminal (minus terminal) and an output terminal of the calculation amplifier 114. A constant voltage V2 is input to a non-inversion input terminal (plus terminal) of the calculation amplifier 114, and the output terminal of the calculation amplifier 114 is connected to a first terminal of the three-terminal switch 13.

The resistance value R2 of the variable resistance 113 is a resistance value according to a gain adjustment value stored in the memory 62.

In the AFC circuit 11 configured as described above, when an input voltage is indicated by VAFC_IN, an output voltage VA of the calculation amplifier 111 is indicated by the following expression (1).

$$VA = V1 - \frac{R2 \cdot (VAFC\_IN - V1)}{R1} \quad (1)$$

An output voltage VB of the calculation amplifier 114 is indicated by the following expression (2).

$$VB = V2 - \frac{R4 \cdot (VA - V2)}{R3} \quad (2)$$

The voltage generation circuit 12 includes n+1 resistances 121-0 to 121-n and n two-terminal switches 122-1 to 122-n.

The n+1 resistances 121-0 to 121-n are connected in series in this order between the power supply and the ground.

In each two-terminal switch 122-$k$ ($k$=1 to n), a first terminal is connected to a connection point between the resistance 121-($k$−1) and the resistance 121-$k$, and a second terminal is connected to a second terminal of the three-terminal switch 13.

Anyone of the n two-terminal switches 122-1 to 122-n is turned on (a first terminal and a second terminal are electrically connected to each other) according to a selected value (an example of "data for controlling the variable capacity control circuit") stored in the memory 61, and other switches are turned off (a first terminal and a second terminal are electrically disconnected from each other). Accordingly, an output voltage VS of the voltage generation circuit 12 (a voltage which is supplied to the second terminal of the three-terminal switch 13) has a voltage value according to the selected value stored in the memory 61.

The three-terminal switch 13 enters either a first state in which the first terminal and a third terminal are electrically connected to each other, or a second state in which the second terminal and the third terminal are electrically connected to each other, according to a control signal from the switch control circuit 70. That is, the three-terminal switch 13 is controlled so that any one of a first terminal and a second terminal of the three-terminal switch 13 and the third terminal of the three-terminal switch 13 are electrically connected to each other.

The temperature compensation circuit 20 includes a temperature sensor 21, a three-terminal switch 22, a function generation circuit 23, and an adder 24.

An output terminal of the temperature sensor 21 is connected to a first terminal of the three-terminal switch 22, and a second terminal of the three-terminal switch 22 is connected to the second terminal of the three-terminal switch 51.

The three-terminal switch 22 enters either a first state in which the first terminal and a third terminal are electrically connected to each other, or a second state in which a second terminal and the third terminal are electrically connected to each other, according to a control signal from the switch control circuit 70. That is, the three-terminal switch 22 is controlled so that any one of the first terminal and the second terminal of the three-terminal switch 22 and the third terminal of the three-terminal switch 22 are electrically connected to each other.

In this embodiment, since frequency temperature characteristics of the resonator 3 (crystal resonator) can be approximated with a cubic expression using the temperature as a variable, the function generation circuit 23 includes a cubic function generation circuit 231, a linear function generation circuit 232, and a zero-order function generation circuit 233.

The cubic function generation circuit 231 with an input terminal connected to the third terminal of the three-terminal switch 22 generates and outputs a cubic function voltage according to a third-order coefficient stored in the memory 63 by using a voltage of the third terminal of the three-terminal switch 22 as a variable.

The linear function generation circuit 232 with an input terminal connected to the third terminal of the three-terminal switch 22 generates and outputs a linear function voltage according to a first-order coefficient stored in the memory 63 by using a voltage of the third terminal of the three-terminal switch 22 as a variable.

The zero-order function generation circuit 233 generates and outputs a constant voltage according to a zero-order coefficient (constant) stored in the memory 63.

The adder 24 adds an output voltage of the cubic function generation circuit 231, an output voltage of the linear function generation circuit 232, and an output voltage of the zero-order function generation circuit 233, and outputs the result. An output terminal of the adder 24 is connected to a first terminal of the three-terminal switch 52.

The circuit 30 for oscillation is connected to the terminal T5 and the terminal T6 to oscillate the resonator 3. In the example of FIG. 1, the circuit 30 for oscillation includes an NPN bipolar transistor 31, resistances 32 and 33, capacitors 34 and 35, a varactor (variable capacity diode) 36, a varactor 37 (an example of "capacity variation unit" and "variable capacity element"), a resistance 38, and a resistance 39.

In the bipolar transistor 31, a base terminal is connected to the terminal T6, a collector terminal is connected to the terminal T5, and an emitter terminal is grounded.

The resistance 32 is connected between the base terminal and the collector terminal of the bipolar transistor 31, and the resistance 33 is connected between the power supply and the collector terminal of the bipolar transistor 31.

The capacitor 34 is connected between the collector terminal of the bipolar transistor 31 and a cathode terminal of the varactor 36, and the capacitor 35 is connected between the base terminal of the bipolar transistor 31 and a cathode terminal of the varactor 37.

An anode terminal of the varactor 36 and an anode terminal of the varactor 37 are grounded.

The resistance 38 is connected between a third terminal of the three-terminal switch 52 and the cathode terminal of the varactor 36, and the resistance 39 is connected between the third terminal of the three-terminal switch 13 and the cathode terminal of the varactor 37.

The circuit 30 for oscillation configured as described above amplifies an output signal of the resonator 3 input from the terminal T6 using the bipolar transistor 31 as an amplification element, and supplies the amplified signal as an input signal of the resonator 3 via the terminal T5. The amplification element for the circuit 30 for oscillation may be realized using a PNP bipolar transistor, a field effect transistor (FET), a metal oxide semiconductor field effect transistor (MOSFET), a thyristor or the like.

A signal of the collector terminal of the bipolar transistor 31 which is an output signal of the circuit 30 for oscillation is input to the output buffer 40, and an output signal of the output buffer 40 is output to the outside from the OUT terminal via the terminal T2.

In the three-terminal switch 51, the first terminal is connected to the terminal T1, the second terminal is connected to the second terminal of the three-terminal switch 22, and the third terminal is connected to one terminal of the resistance 112.

The three-terminal switch 51 enters either a first state in which the first terminal and the third terminal are electrically connected to each other, or a second state in which the first terminal and the second terminal are electrically connected to each other, according to a control signal from the switch control circuit 70. That is, the three-terminal switch 51 is controlled so that any one of the second terminal and the third terminal of the three-terminal switch 51 and the first terminal of the three-terminal switch 51 are electrically connected to each other.

In the three-terminal switch 52, the first terminal is connected to the output terminal of the adder 24, a constant voltage V3 is input to a second terminal, and the third terminal is connected to one terminal of the resistance 38.

The three-terminal switch 52 enters either a first state in which the first terminal and the third terminal are electrically connected to each other, or a second state in which the second terminal and the third terminal are electrically connected to each other, according to a control signal from the switch control circuit 70. That is, the three-terminal switch 52 is controlled so that any one of the first terminal and the second terminal of the three-terminal switch 52 and the third terminal of the three-terminal switch 52 are electrically connected to each other.

The switch control circuit 70 generates a control signal to control the three-terminal switch 51, the three-terminal switch 52, the three-terminal switch 13, and the three-terminal switch 22 according to a set mode.

The interface (I/F) circuit 80 determines whether a voltage of the VCC terminal is higher or lower than a threshold. When the voltage of the VCC terminal is higher than the threshold, the interface (I/F) circuit 80 receives a clock signal SCLK externally input from the VC terminal via the terminal T1 and a data signal DATA externally input from the OUT terminal via the terminal T2 to read or write data from or to an internal register or an internal memory (not shown).

Modes of Oscillation Circuit

Figure 2:
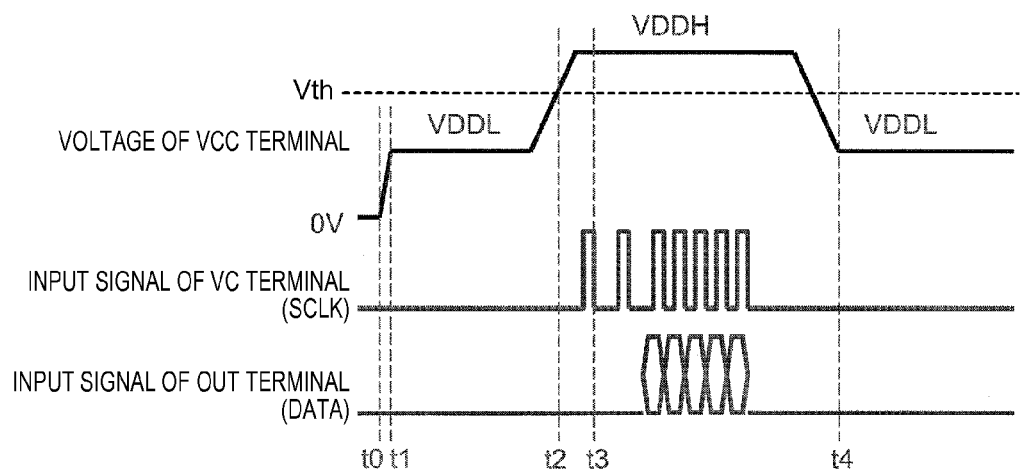
FIG. 2 is a timing chart for illustrating a mode switching operation.

In this embodiment, the oscillation circuit 2 is set to a normal operation mode when the VCC terminal is powered on. In addition, the oscillation circuit 2 can be switched to any one of a plurality of modes including a temperature compensation adjustment mode and a resonator characteristic measurement mode via the interface (I/F) circuit 80. FIG. 2 is a timing chart for illustrating this mode switching operation. In FIG. 2, the horizontal axis corresponds to time, and the vertical axis corresponds to voltage. In the timing chart of FIG. 2, the voltage of the VCC terminal (terminal T3), the clock signal SCLK input from the VC terminal (terminal T1), and the data signal DATA input from the OUT terminal (terminal T2) are shown.

In the example shown in FIG. 2, the voltage of the VCC terminal is 0 V at a time t0, a voltage VDDL at a time t1, a reference value Vth at a time t2, and thereafter, it is increased to a voltage VDDH. Communication is enabled at a time t3 which is a time at which a drop in an initial pulse of the clock signal SCLK input during a period of time during which the voltage of the VCC terminal is the voltage VDDH is shown. The next pulse of the clock signal SCLK is a pulse for test mode setting, and according to a 5-bit data signal DATA input in synchronization with the subsequent five pulses, the kind of test mode is selected. Switching to the selected test mode is carried out at a time t4 at which the voltage of the VCC terminal returns to the voltage VDDL. By setting the 5-bit data signal DATA to a predetermined value, the oscillation circuit 2 can be set to the selected test mode.

In the normal operation mode, as shown in FIG. 1, the three-terminal switch 13 enters the first state in which the first terminal and the third terminal are electrically connected to each other, the three-terminal switch 22 enters the first state in which the first terminal and the third terminal are electrically connected to each other, the three-terminal switch 51 enters the first state in which the first terminal and the third terminal are electrically connected to each other, and the three-terminal switch 52 enters the first state in which the first terminal and the third terminal are electrically connected to each other.

Accordingly, in the normal operation mode, an output voltage of the function generation circuit 23 generated based on an output voltage of the temperature sensor 21 is applied to the cathode terminal of the varactor 36, and the frequency temperature characteristics of the resonator 3 are corrected (temperature compensation). In addition, an output voltage VB of the AFC circuit generated based on the voltage of the VC terminal is applied to the cathode terminal of the varactor as a voltage VAFC, and the oscillation frequency is controlled. That is, the oscillator 1 of this embodiment is a voltage-controlled temperature-compensated crystal oscillator (VC-TCXO), and when the expression (1) is substituted into the expression (2) with V2=V1 and R3=R4, the voltage VAFC in the normal operation mode is indicated by the following expression (3).

$$VAFC = VB = V1 + \frac{R2}{R1}(VAFC\_IN - V1) \quad (3)$$

As shown by the expression (3), a gain of the AFC circuit 11 is R2/R1, and the voltage VAFC is controlled by the voltage VAFC_IN, that is, the voltage of the VC terminal.

Figure 4:
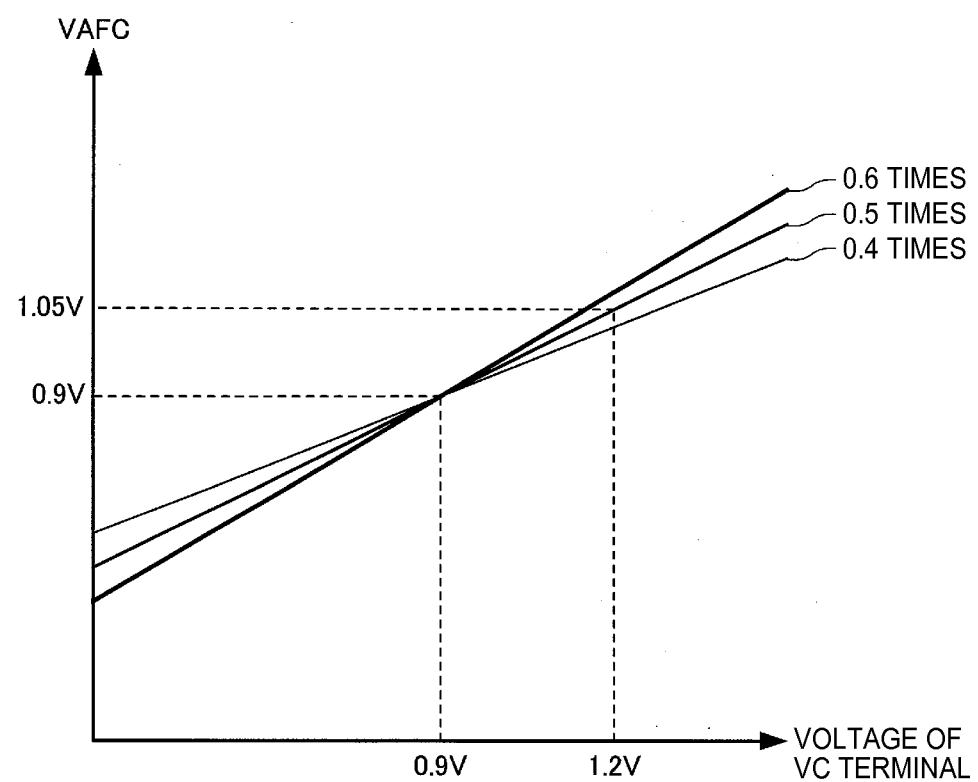
FIG. 4 is a graph showing a relationship between a voltage of a VC terminal and a voltage VAFC.

FIG. 4 is a graph showing a relationship between the voltage of the VC terminal (=VAFC_IN) and a voltage VAFC when the gain (R2/R1) of the AFC circuit 11 is 0.4 times, 0.5 times, and 0.6 times with V1=V2=0.9 V and R3=R4. For example, when the gain of the AFC circuit 11 is 0.5 times, the voltage VAFC is 0.9 V±0.35 V when the voltage of the VC terminal is 0.9 V±0.7 V, and the voltage VAFC is 1.05 V±0.5 V when the voltage of the VC terminal is 1.2 V±1 V.

Figure 3A:
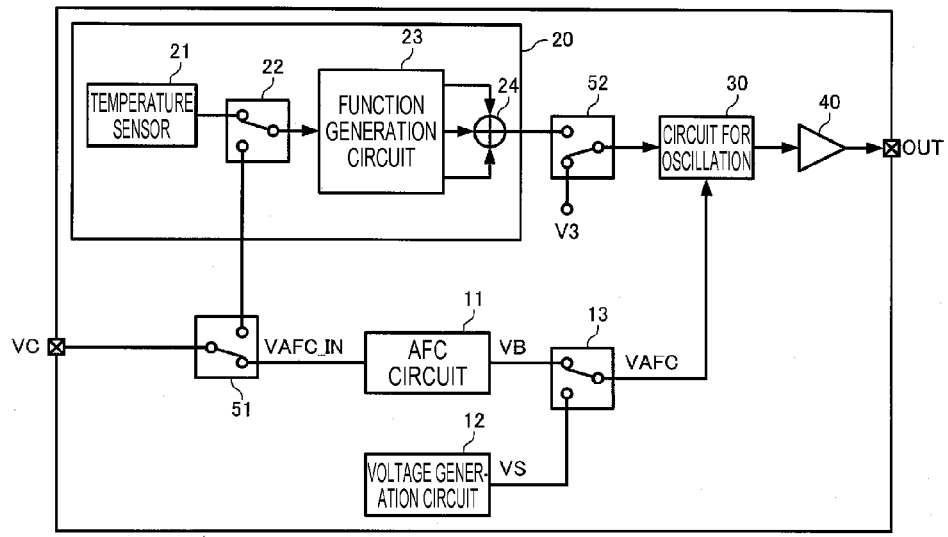
FIG. 3A is a diagram showing switch connection states in a resonator characteristic measurement mode.

In addition, in the resonator characteristic measurement mode, as shown in FIG. 3A, the three-terminal switch 13 enters the first state in which the first terminal and the third terminal are electrically connected to each other, the three-terminal switch 22 enters the first state in which the first terminal and the third terminal are electrically connected to each other, the three-terminal switch 51 enters the first state in which the first terminal and the third terminal are electrically connected to each other, and the three-terminal switch 52 enters the second state in which the second terminal and the third terminal are electrically connected to each other. In FIG. 3A, some configurations and the internal configurations of the function generation circuit 23, the circuit 30 for oscillation, the AFC circuit 11, and the voltage generation circuit 12 are omitted, but the respective configurations are the same as in FIG. 1.

Accordingly, in the resonator characteristic measurement mode, a constant voltage V3 is applied to the cathode terminal of the varactor 36, and the frequency temperature characteristics of the resonator 3 are not corrected (temperature compensation). In addition, an output voltage VAFC of the AFC circuit generated based on the voltage of the VC terminal is applied to the cathode terminal of the varactor 37, and the oscillation frequency is controlled. Accordingly, by inputting the constant voltage from the VC terminal and by measuring the frequency of the oscillation signal output from the OUT terminal when the temperature is varied within a desired temperature range, the frequency temperature characteristics of the resonator 3 can be acquired.

Figure 3B:
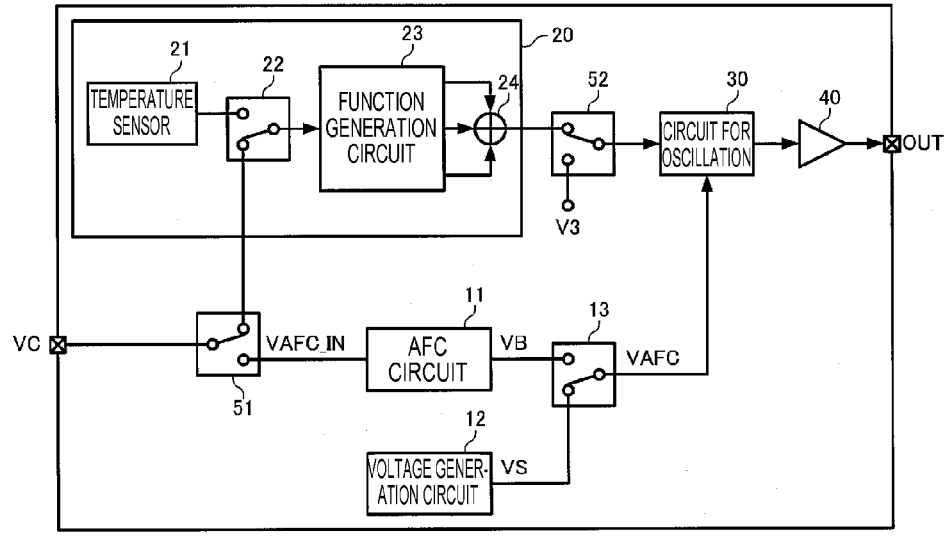
FIG. 3B is a diagram showing switch connection states in a temperature compensation adjustment mode.

In addition, in the temperature compensation adjustment mode, as shown in FIG. 3B, the three-terminal switch 13 enters the second state in which the second terminal and the third terminal are electrically connected to each other, the three-terminal switch 22 enters the second state in which the second terminal and the third terminal are electrically connected to each other, the three-terminal switch 51 enters the second state in which the first terminal and the second terminal are electrically connected to each other, and the three-terminal switch 52 enters the first state in which the first terminal and the third terminal are electrically connected to each other. In FIG. 3B, some configurations and the internal configurations of the function generation circuit 23, the circuit 30 for oscillation, the AFC circuit 11, and the voltage generation circuit 12 are omitted, but the respective configurations are the same as in FIG. 1.

Accordingly, in the temperature compensation adjustment mode, an output voltage of the function generation circuit 23 generated based on the voltage of the VC terminal is applied to the cathode terminal of the varactor 36, and a constant voltage VS generated (selected) by the voltage generation circuit 12 is applied to the cathode terminal of the varactor 37. Accordingly, by inputting, from the VC terminal, a voltage corresponding to the output voltage of the temperature sensor 21 when the temperature is varied within a desired temperature range at a constant temperature (for example, 25° C.), and by measuring the frequency of the oscillation signal output from the OUT terminal, information of a cubic function voltage, a linear function voltage, and a zero-order function voltage is acquired and the frequency temperature characteristics of the resonator 3 are corrected (temperature compensation), and thus a third-order coefficient, a first-order coefficient, and a zero-order coefficient (constant) suitable for adjusting the oscillation frequency within a desired temperature range so as to approach a target frequency can be calculated.

Here, for example, in the case in which V1=V2=0.9 V and R3=R4 are set and the voltage VS is fixed to 0.9 V, regardless of the range of the voltage which is applied to the VC terminal, when a center voltage of the VC terminal is 0.9 V as in the case in which the voltage of the VC terminal in the normal operation mode is 0.9 V±0.7 V, a center voltage of a voltage which is applied to the cathode terminal of the varactor 37 via the VC terminal in the normal operation mode matches a voltage which is applied to the cathode terminal of the varactor 37 in the temperature compensation adjustment mode. Therefore, a capacity value of the varactor 37 in the temperature compensation adjustment mode matches a capacity value of the varactor 37 when the voltage of the VC terminal is the center voltage in the normal operation mode, and an oscillation frequency temperature-compensated when the voltage of the VC terminal is the center voltage in the normal operation mode matches a target frequency. However, when the center voltage of the VC terminal is not 0.9 V as in the case in which the voltage of the VC terminal is 1.2 V±1 V, a voltage which is applied to the cathode terminal of the varactor 37 when the voltage of the VC terminal is the center voltage 1.2 V in the normal operation mode is 1.05 V, and a voltage which is applied to the cathode terminal of the varactor 37 in the temperature compensation adjustment mode is 0.9 V. The voltage which is applied to the cathode terminal of the varactor 37 in the normal mode does not match that in the temperature compensation adjustment mode. Therefore, a capacity value of the varactor 37 in the temperature compensation adjustment mode does not match a capacity value of the varactor 37 when the voltage of the VC terminal is the center voltage in the normal operation mode, and an oscillation frequency temperature-compensated when the voltage of the VC terminal is the center voltage in the normal operation mode deviates from a target frequency.

Accordingly, the oscillator 1 of this embodiment is configured so that the voltage VS is selectable according to the selected value stored in the memory 61, and is configured so that by selecting, as the voltage VS which is applied to the cathode terminal of the varactor 37 in the temperature compensation adjustment mode, a voltage closest to the voltage which is applied to the cathode terminal of the varactor 37 when the voltage of the VC terminal is the center voltage in the normal operation mode, optimum temperature compensation adjustment can be performed.

In addition, as the voltage VS which is applied to the varactor 37 can be precisely set, the capacity value of the varactor 37 can be precisely adjusted. In the temperature compensation mode, when a voltage step of the voltage VS which is applied to adjust the capacity value of the varactor 37 is 0.1 V or higher, a variation in the capacity value of the varactor 37 occurring because the voltage which is applied to the varactor 37 in the normal mode is different from that in the temperature compensation mode is large, and thus optimum temperature compensation adjustment cannot be performed in the temperature compensation mode. Therefore, when the voltage step of the voltage VS which is applied to the varactor 37 in the temperature compensation mode is adjusted to 0.1 V or lower, and preferably 0.05 V or lower, optimum temperature compensation adjustment can be performed in the temperature compensation mode.

For example, in general, a center voltage of a voltage which is applied to the VC terminal (a center voltage of VAFC_IN) in the normal operation mode is approximately 0.9 V to 1.6 V, and the voltage VS when V1=V2=0.9 V and R3=R4 are set and the gain (R2/R1) of the AFC circuit 11 is 0.5 times is approximately 0.9 V to 1.25 V from the expression (3). Accordingly, in order to adjust the voltage step of the voltage VS to 0.05 V or lower, since the voltage VS is approximately 0.9 V to 1.25 V (width: 0.35 V), the voltage step of the voltage VS can be adjusted to 0.05 V or lower when a memory amount necessary for setting the voltage VS is not smaller than three bits (eight arrangements), and thus optimum temperature compensation adjustment can be performed. As the memory amount for setting the voltage VS, the center voltage of VAFC_IN, V1, V2, R1, R2, R3, and R4 have been exemplified and calculated, but it is not limited thereto. The memory amount may be appropriately set so that the voltage step of the voltage VS is 0.1 V or lower, and preferably 0.05 V or lower according to the center voltage of VAFC_IN, V1, V2, R1, R2, R3, and R4.

Oscillator Manufacturing Method

Figure 5:
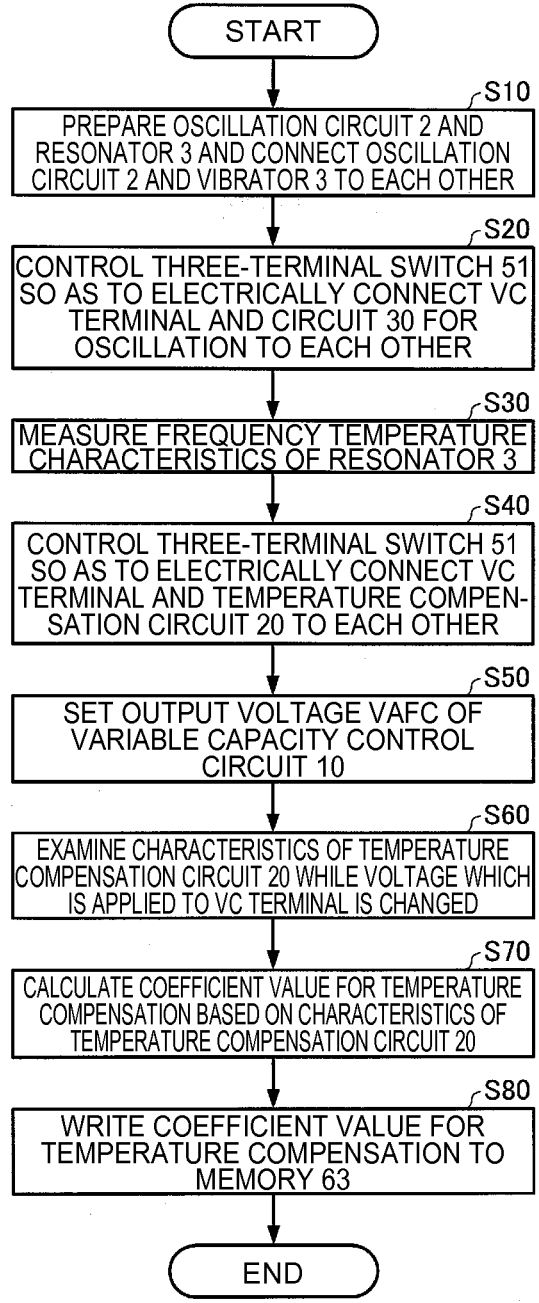
FIG. 5 is a flowchart showing an example of an oscillator manufacturing method of the first embodiment.

FIG. 5 is a flowchart showing an example of an oscillator manufacturing method of the first embodiment. The oscillator manufacturing method of this embodiment includes Steps S10 to S80 shown in FIG. 5. However, in the oscillator manufacturing method of this embodiment, some of Steps S10 to S80 may be omitted or changed, or other steps may be added.

As shown in FIG. 5, in this embodiment, first, the oscillation circuit 2 and the resonator 3 are prepared, and the oscillation circuit 2 and the resonator 3 are electrically connected to each other (Step S10).

Next, the three-terminal switch 51 is controlled so as to electrically connect the VC terminal and the circuit 30 for oscillation to each other (Step S20).

Next, frequency temperature characteristics of the resonator 3 are measured (Step S30).

Next, the three-terminal switch 51 is controlled so as to electrically connect the VC terminal and the temperature compensation circuit 20 to each other (Step S40).

Next, an output voltage VAFC of the variable capacity control circuit 10 is set (Step S50).

Next, while a voltage which is applied to the VC terminal is changed, characteristics of the temperature compensation circuit 20 are examined (Step S60).

Next, a coefficient value for temperature compensation is calculated based on the characteristics of the temperature compensation circuit 20 examined in Step S60 (Step S70).

Next, the coefficient value for temperature compensation obtained in Step S70 is written to the memory 63 (Step S80).

Figure 6:
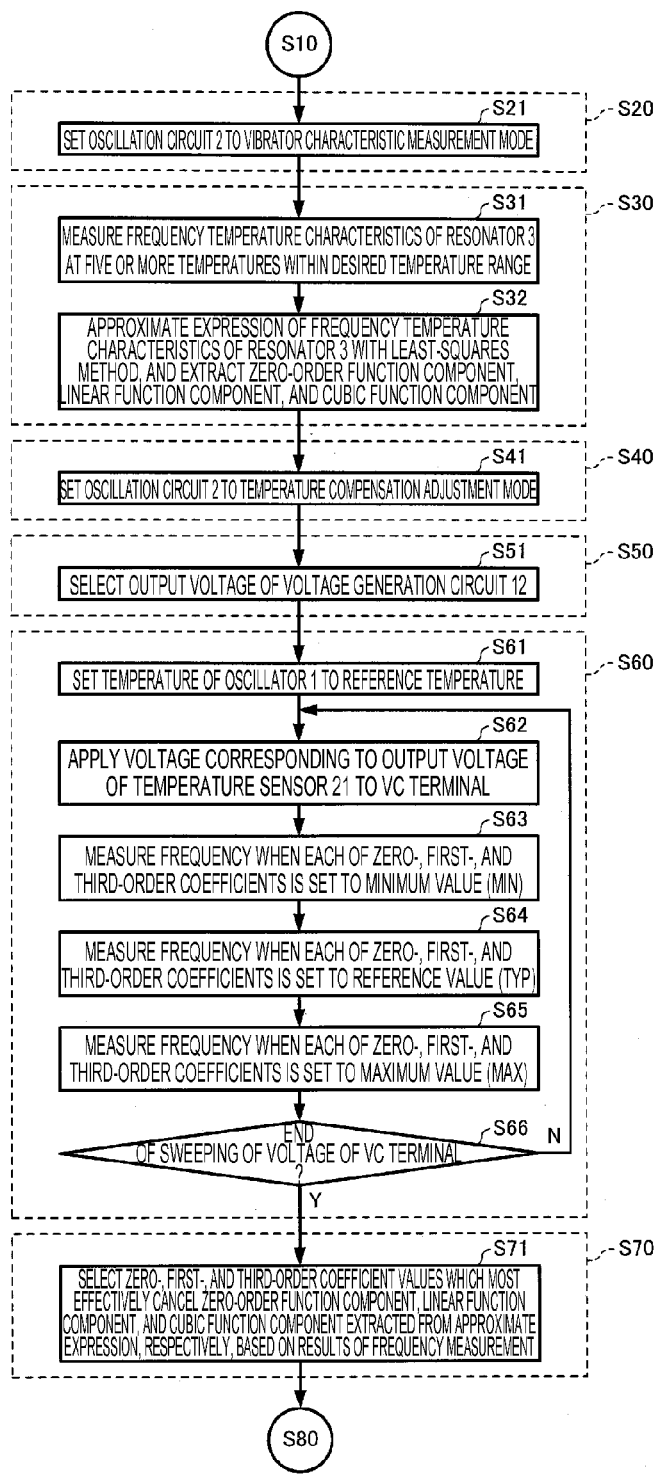
FIG. 6 is a detailed flowchart of Steps S20 to S70 in FIG. 5.

FIG. 6 is a detailed flowchart of Steps S20 to S70 in FIG. 5. As shown in FIG. 6, in this embodiment, the oscillation circuit 2 is set to the resonator characteristic measurement mode (S21) as Step S20. Accordingly, each of the three-terminal switch 13, the three-terminal switch 22, the three-terminal switch 51, and the three-terminal switch 52 enters the connection state shown in FIG. 3A.

As Step S30, first, frequency temperature characteristics of the resonator 3 at five or more temperatures within a desired temperature range are measured (S31). Specifically, for example, in a state in which the oscillator 1 is accommodated in a thermostatic bath and a center voltage in the normal operation mode is applied to the VC terminal, frequencies of oscillation signals output from the OUT terminal at five or more temperatures are measured while the temperature of the thermostatic bath is changed.

Next, an expression of the frequency temperature characteristics of the resonator 3 obtained from the measurement of Step S31 is approximated with a least-squares method, and a zero-order function component, a linear function component, and a cubic function component are extracted (S32).

As Step S40, the oscillation circuit 2 is set to the temperature compensation adjustment mode (S41). Accordingly, each of the three-terminal switch 13, the three-terminal switch 22, the three-terminal switch 51, and the three-terminal switch 52 enters the connection state shown in FIG. 3B, the VC terminal and the AFC circuit 11 are electrically disconnected from each other, and the VC terminal and the temperature compensation circuit 20 are electrically connected to each other.

As Step S50, an output voltage VS of the voltage generation circuit 12 is selected (S51). Specifically, a center voltage of the VC terminal in the normal operation mode is regarded as the voltage VAFC_IN, and a value selected so that the voltage VS is the closest to the voltage VB calculated through the expressions (1) and (2) is written to the memory 61. For example, when V1=V2=0.9 V, R3=R4, and R2/R1=0.5 are set, a value selected so that the voltage VS is the closest to 0.9 V is written when the center voltage of the VC terminal in the normal operation mode is 0.9 V, and a value selected so that the voltage VS is the closest to 1.05 V is written when the center voltage of the VC terminal in the normal operation mode is 1.2 V.

As Step S60, first, the temperature of the oscillator 1 is set to a reference temperature (S61). Specifically, for example, the temperature of the thermostatic bath which accommodates the oscillator 1 is set to the reference temperature.

Next, a voltage corresponding to an output voltage of the temperature sensor 21 is applied to the VC terminal (S62). Specifically, a first voltage equal to the output voltage of the temperature sensor 21 at a first temperature included in the desired temperature range is applied to the VC terminal.

Next, a frequency when each of zero-, first-, and third-order coefficients is set to a minimum value (MIN) is measured (S63). Specifically, the first-order coefficient and the third-order coefficient are set to zero, the zero-order coefficient is set to a minimum value (MIN), and a frequency of an oscillation signal output from the OUT terminal is measured. In addition, the zero-order coefficient and the third-order coefficient are set to zero, the first-order coefficient is set to a minimum value (MIN), and a frequency of an oscillation signal output from the OUT terminal is measured. In addition, the zero-order coefficient and the first-order coefficient are set to zero, the third-order coefficient is set to a minimum value (MIN), and a frequency of an oscillation signal output from the OUT terminal is measured.

Next, a frequency when each of the zero-, first-, and third-order coefficients is set to a reference value (TYP) is measured (S64). Specifically, the first-order coefficient and the third-order coefficient are set to zero, the zero-order coefficient is set to a reference value (TYP), and a frequency of an oscillation signal output from the OUT terminal is measured. In addition, the zero-order coefficient and the third-order coefficient are set to zero, the first-order coefficient is set to a reference value (TYP), and a frequency of an oscillation signal output from the OUT terminal is measured. In addition, the zero-order coefficient and the first-order coefficient are set to zero, the third-order coefficient is set to a reference value (TYP), and a frequency of an oscillation signal output from the OUT terminal is measured.

Next, a frequency when each of the zero-, first-, and third-order coefficients is set to a maximum value (MAX) is measured (S65). Specifically, the first-order coefficient and the third-order coefficient are set to zero, the zero-order coefficient is set to a maximum value (MAX), and a frequency of an oscillation signal output from the OUT terminal is measured. In addition, the zero-order coefficient and the third-order coefficient are set to zero, the first-order coefficient is set to a maximum value (MAX), and a frequency of an oscillation signal output from the OUT terminal is measured. In addition, the zero-order coefficient and the first-order coefficient are set to zero, the third-order coefficient is set to a maximum value (MAX), and a frequency of an oscillation signal output from the OUT terminal is measured.

Next, when the sweeping of the voltage of the VC terminal corresponding to the range of the output voltage of the temperature sensor 21 within the desired temperature range does not end (N in S66), a second voltage equal to the output voltage of the temperature sensor 21 at a second temperature included in the desired temperature range is applied to the VC terminal (S62), and Step S63 and the subsequent steps are performed again.

When the sweeping of the voltage of the VC terminal ends (Y in S66), as Step S70, zero-, first-, and third-order coefficient values which most effectively cancel the zero-order function component, the linear function component, and the cubic function component extracted from the approximate expression in Step S32, respectively, are selected based on the results of the frequency measurement in Steps S61 to S66 (S71). Specifically, from the results of the frequency measurement in Steps S61 to S66, an expression of the zero-order function voltage using, as a variable, the voltage value of the VC terminal (corresponding to the voltage value of the temperature sensor 21) when the zero-order coefficient is respectively set to a minimum value (MIN), a reference value (TYP), and a maximum value (MAX) is calculated, and based on these calculation results, a zero-order coefficient value at which the zero-order function voltage most effectively cancels the zero-order function component extracted in Step S32 is selected. Similarly, an expression of the linear function voltage using, as a variable, the voltage value of the VC terminal when the first-order coefficient is respectively set to a minimum value (MIN), a reference value (TYP), and a maximum value (MAX) is calculated, and based on these calculation results, a first-order coefficient value at which the linear function voltage most effectively cancels the linear function component extracted in Step S32 is selected. Similarly, an expression of the cubic function voltage using, as a variable, the voltage value of the VC terminal when the third-order coefficient is respectively set to a minimum value (MIN), a reference value (TYP), and a maximum value (MAX) is calculated, and based on these calculation results, a third-order coefficient value at which the cubic function voltage most effectively cancels the cubic function component extracted in Step S32 is selected.

The zero-order function voltage does not change by the voltage value of the VC terminal (corresponding to the voltage value of the temperature sensor 21). Accordingly, the frequency when the zero-order coefficient is respectively set to a minimum value (MIN), a reference value (TYP), and a maximum value (MAX) may be respectively measured in Steps S63, S64, and S65 only when the voltage of the VC terminal is the first voltage.

The oscillator 1 can also be measured using, other than the above-described example of the manufacturing method, for example, a method including controlling the three-terminal switch 51 so as to electrically connect the VC terminal and the circuit 30 for oscillation to each other in Step S40, and examining the characteristics of the circuit 30 for oscillation while changing a voltage which is applied to the VC terminal in Step S60.

As described above, according to the oscillator of the first embodiment, the temperature compensation characteristics can be adjusted in a state in which the output voltage of the voltage generation circuit 12 is set to a voltage closest to the output voltage VB of the calculation amplifier 114 (the output voltage of the AFC circuit) when the center voltage is applied to the VC terminal during normal operation. Accordingly, in a state in which the voltage which is applied to the varactor 37 is the closet to the voltage which is applied to the varactor 37 when the center voltage is applied to the VC terminal during normal operation, that is, in a state in which the capacity value of the varactor 37 almost matches the capacity value when the center voltage is applied to the VC terminal during normal operation, the temperature compensation characteristics can be adjusted, and thus it is possible to reduce errors in the adjustment of the temperature compensation characteristics. Therefore, according to this embodiment, an oscillator having good frequency temperature characteristics can be provided. In addition, the first embodiment has described that the memory 61, the memory 62, and the memory 63 are separately configured, but for example, the memory 62 may only be provided and may have the functions of the memory 61 and the memory 63. Furthermore, as the memory 61, the memory 62, and the memory 63, for example, various known non-volatile memories such as an electrically erasable programmable read-only memory (EEPROM) and a rewritable non-volatile memory, e.g., a flash memory, and various known volatile memories such as a dynamic random access memory (DRAM) and a static random access memory (SRAM) can be employed.

Modification Example

Figure 7:
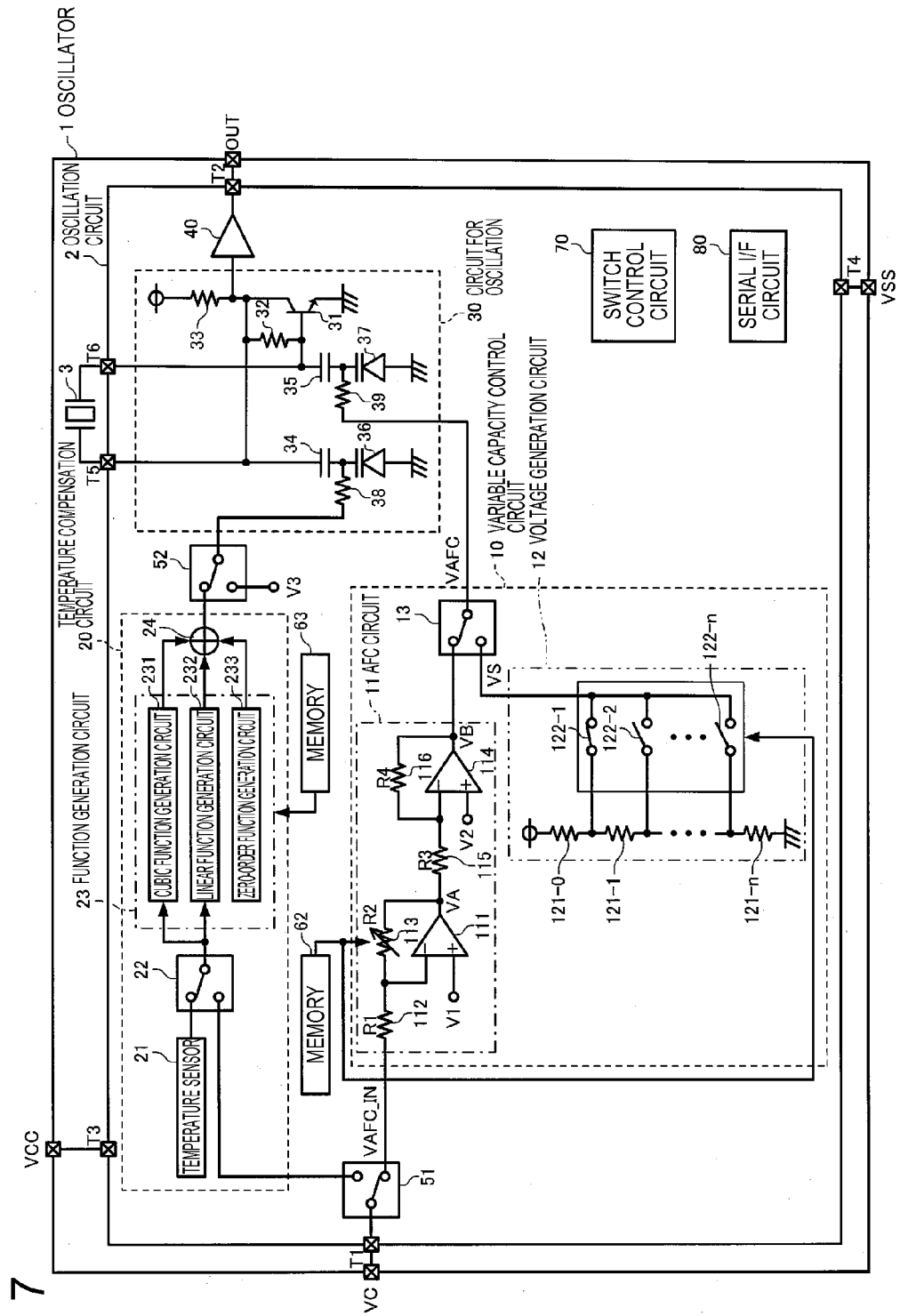
FIG. 7 is a functional block diagram of a modification example of the oscillator of the first embodiment.

FIG. 7 is a functional block diagram of a modification example of the oscillator 1 of the first embodiment. In FIG. 7, the same constituent elements as those in FIG. 1 will be denoted by the same reference numerals, and the description thereof will be omitted.

In the oscillator 1 of the first embodiment shown in FIG. 1, as the voltage VAFC, only one of the voltage VB and the voltage VS is selected by the three-terminal switch 13, and thus the other voltage which has not been selected may have any voltage value. In the modification example of FIG. 7, the region where a selected value for selecting which one of the n two-terminal switches 122-1 to 122-n is to be turned on is stored, and the region where a gain adjustment value of the AFC circuit 11 is stored are made to be shared. That is, the memory 61 existing in FIG. 1 does not exist in FIG. 7, and in the memory 62, an address of the gain adjustment value of the AFC circuit 11 and an address of the selected value for the two-terminal switches 122-1 to 122-n are made to be shared, and a storage region corresponding to the address is used in common.

As shown in FIGS. 7 and 3A, in the normal operation mode and in the resonator characteristic measurement mode (a state in which the VC terminal and the AFC circuit 11 are electrically connected to each other, and the AFC circuit 11 and the circuit 30 for oscillation are electrically connected to each other), the voltage VB is selected as the voltage VAFC by the three-terminal switch 13, and thus a value (an example of the first data) stored in a predetermined storage region of the memory 62 is used as a gain adjustment value of the AFC circuit 11.

In addition, as shown in FIG. 3B, in the temperature compensation adjustment mode (a state in which the VC terminal and the AFC circuit 11 are electrically separated from each other, and the voltage generation circuit 12 and the circuit 30 for oscillation are electrically connected to each other), the voltage VS is selected as the voltage VAFC by the three-terminal switch 13, and thus a value (an example of the second data) stored in a predetermined storage region of the memory 62 is used as a selected value for the two-terminal switches 122-1 to 122-n.

According to the oscillator 1 of this modification example, since the memory 62 is used also as the memory for storing the selected value for the two-terminal switches 122-1 to 122-n and as the memory for storing the gain adjustment value of the AFC circuit 11, this oscillator is advantageous for size reduction. The oscillator 1 of this modification example achieves similar effects to those of the oscillator 1 of the first embodiment.

1-2. Second Embodiment

Figure 8:
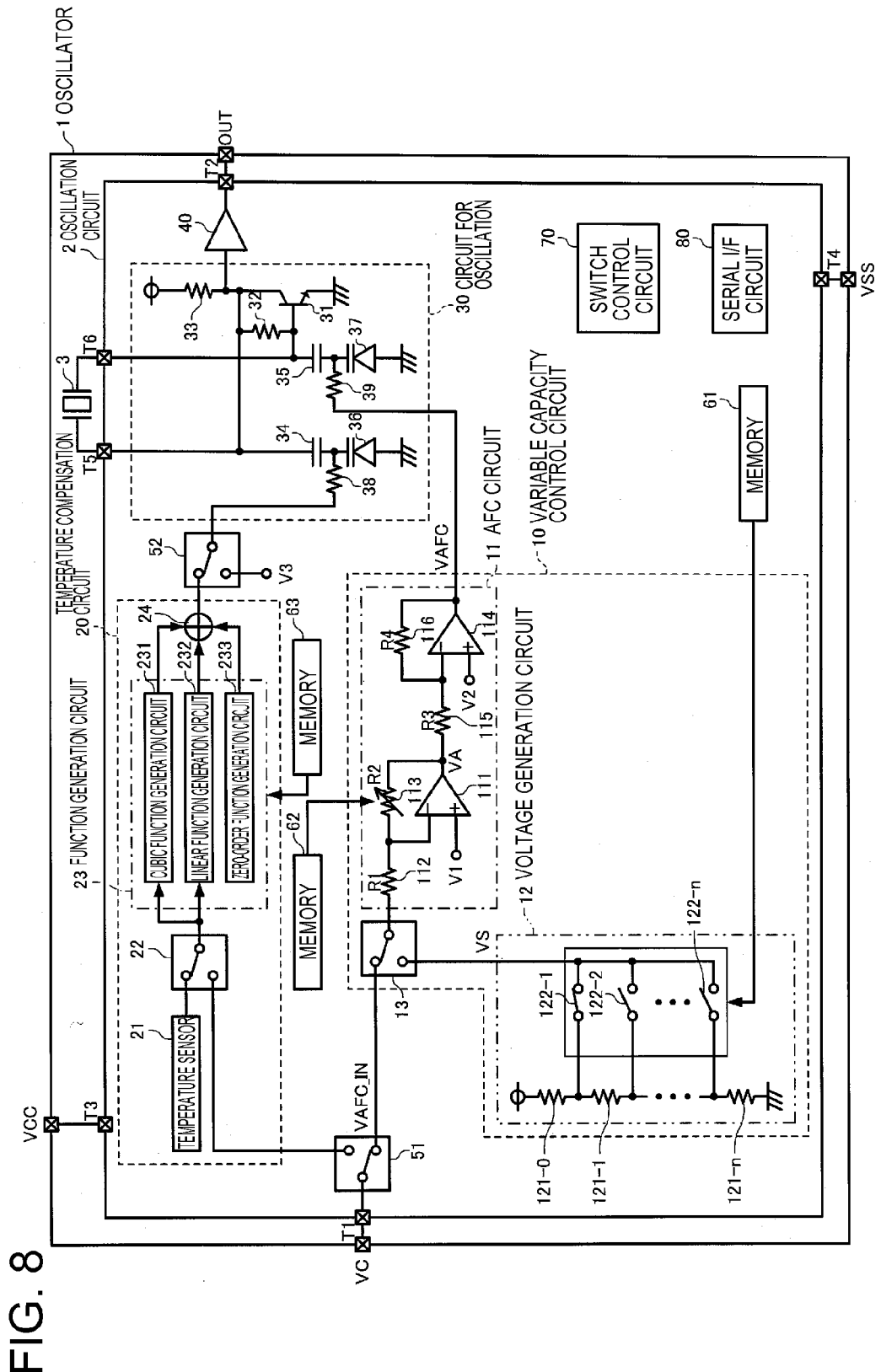
FIG. 8 is a functional block diagram of an oscillator of a second embodiment.

FIG. 8 is a functional block diagram of an oscillator of a second embodiment. As shown in FIG. 8, an oscillator 1 of the second embodiment includes an oscillation circuit 2 and a resonator 3, and the oscillation circuit 2 and the resonator 3 are accommodated in a package (not shown). In FIG. 8, the same constituent elements as those in FIG. 1 will be denoted by the same reference numerals, and the description thereof will be omitted.

As shown in FIG. 8, in the oscillator 1 of the second embodiment, the three-terminal switch 13 is positioned at a different position compared to the first embodiment (FIG. 1). That is, in the three-terminal switch 13 (an example of "second switching portion"), the first terminal is connected to the third terminal of the three-terminal switch 51, the second terminal is connected to the output terminal of the voltage generation circuit 12, and the third terminal is connected to one terminal of the resistance 112. Since other configurations of the oscillator 1 of the second embodiment shown in FIG. 8 are similar to those of the first embodiment (FIG. 1), the description thereof will be omitted.

Similarly to the first embodiment, in the oscillator 1 of the second embodiment, the oscillation circuit 2 is set to a normal operation mode when power is applied, and can be switched to any one of a plurality of modes including a temperature compensation adjustment mode and a resonator characteristic measurement mode via the interface (I/F) circuit 80. The connection states of the three-terminal switch 51, the three-terminal switch 52, and the three-terminal switch 22 in each of the normal operation mode, the resonator characteristic measurement mode, and the temperature compensation adjustment mode are similar to those of the first embodiment.

In the normal operation mode and in the resonator characteristic measurement mode, the three-terminal switch 13 enters the first state in which the first terminal and the third terminal are electrically connected to each other, and a voltage VAFC_IN (equal to a voltage of the VC terminal) of the third terminal of the three-terminal switch 51 is input to the AFC circuit 11. Accordingly, in the normal operation mode and in the resonator characteristic measurement mode, an output voltage VB of the AFC circuit generated based on the voltage of the VC terminal is applied to the cathode terminal of the varactor 37 as a voltage VAFC, and the oscillation frequency is controlled.

In addition, in the temperature compensation adjustment mode, the three-terminal switch 13 enters the second state in which the second terminal and the third terminal are electrically connected to each other, and an output voltage VS (an example of the voltage other than the voltage which is input from the first terminal) of the voltage generation circuit 12 is input to the AFC circuit 11. Accordingly, in the temperature compensation adjustment mode, an output voltage VB of the AFC circuit generated based on a constant voltage VS generated (selected) by the voltage generation circuit 12 is applied to the cathode terminal of the varactor 37 as a voltage VAFC.

The oscillator 1 of the second embodiment is configured so that by selecting the voltage VS so that a voltage which is applied to the cathode terminal of the varactor 37 in the temperature compensation adjustment mode is the closest to a voltage which is applied to the cathode terminal of the varactor 37 when the voltage of the VC terminal is a center voltage in the normal operation mode, optimum temperature compensation adjustment can be performed.

Since a flowchart of an oscillator manufacturing method of the second embodiment is similar to that of the first embodiment (FIGS. 5 and 6), it will not be shown and the description thereof will be omitted.

However, in the second embodiment, in Step S51 of FIG. 6, a value selected so that the voltage VS is the closest to the center voltage of the VC terminal in the normal operation mode is written to the memory 61. For example, a value selected so that the voltage VS is the closest to 0.9 V is written when the center voltage of the VC terminal in the normal operation mode is 0.9 V, and a value selected so that the voltage VS is the closest to 1.2 V is written when the center voltage of the VC terminal in the normal operation mode is 1.2 V.

As described above, according to the oscillator of the second embodiment, the temperature compensation characteristics can be adjusted in a state in which the output voltage of the voltage generation circuit 12 is set to a voltage closest to the center voltage which is applied to the VC terminal in the normal operation mode. Accordingly, in a state in which the voltage which is applied to the varactor 37 is the closest to the voltage which is applied to the varactor 37 when the center voltage is applied to the VC terminal during normal operation, that is, in a state in which the capacity value of the varactor 37 almost matches the capacity value when the center voltage is applied to the VC terminal during normal operation, the temperature compensation characteristics can be adjusted, and thus it is possible to reduce errors in the adjustment of the temperature compensation characteristics. Therefore, according to this embodiment, an oscillator having good frequency temperature characteristics can be provided.

According to the oscillator of the second embodiment, since the output voltage of the voltage generation circuit 12 may be set to a voltage closest to the center voltage which is applied to the VC terminal during normal operation, the output voltage of the voltage generation circuit 12 is extremely easily set.

1-3. Third Embodiment

Figure 9:
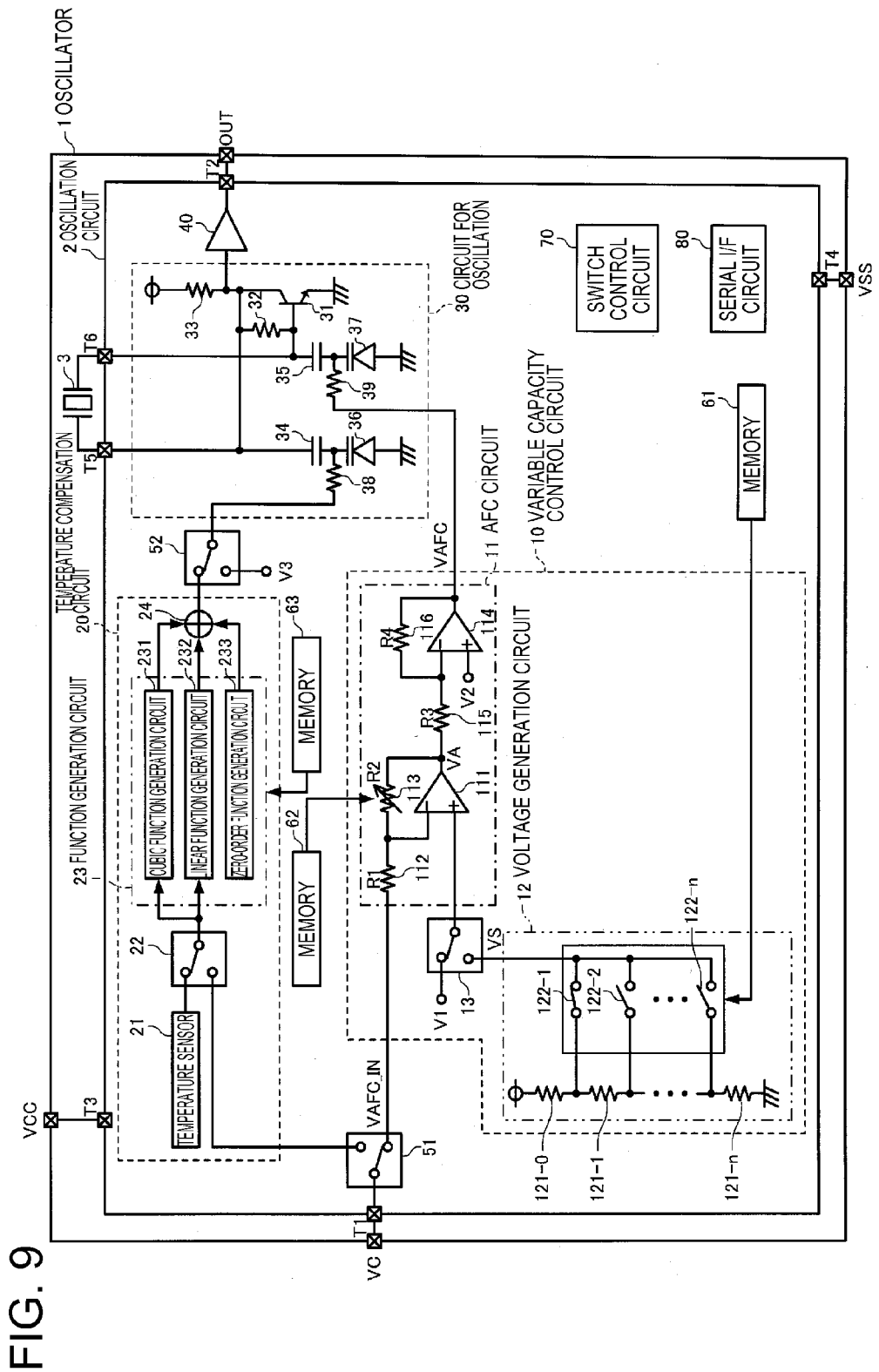
FIG. 9 is a functional block diagram of an oscillator of a third embodiment.

FIG. 9 is a functional block diagram of an oscillator of a third embodiment. As shown in FIG. 9, an oscillator 1 of the third embodiment includes an oscillation circuit 2 and a resonator 3, and the oscillation circuit 2 and the resonator 3 are accommodated in a package (not shown). In FIG. 9, the same constituent elements as those in FIG. 1 and FIG. 8 will be denoted by the same reference numerals, and the description thereof will be omitted.

As shown in FIG. 9, in the oscillator 1 of the third embodiment, the three-terminal switch 13 is positioned at a different position compared to the first embodiment (FIG. 1) and the second embodiment (FIG. 8). That is, in the three-terminal switch 13 (an example of "second switching portion"), a constant voltage V1 is input to the first terminal, an output voltage VS of the voltage generation circuit 12 is input to the second terminal, and the third terminal is connected to the non-inversion input terminal (plus terminal) of the calculation amplifier 111. Since other configurations of the oscillator 1 of the third embodiment shown in FIG. 9 are similar to those of the first embodiment (FIG. 1) and the second embodiment (FIG. 8), the description thereof will be omitted.

Similarly to the first embodiment and the second embodiment, in the oscillator 1 of the third embodiment, the oscillation circuit 2 is set to a normal operation mode when power is applied, and can be switched to any one of a plurality of modes including a temperature compensation adjustment mode and a resonator characteristic measurement mode via the interface (I/F) circuit 80. The connection states of the three-terminal switch 51, the three-terminal switch 52, and the three-terminal switch 22 in each of the normal operation mode, the resonator characteristic measurement mode, and the temperature compensation adjustment mode are similar to those of the first embodiment.

In the normal operation mode and in the resonator characteristic measurement mode, the three-terminal switch 13 enters the first state in which the first terminal and the third terminal are electrically connected to each other, and the constant voltage V1 is input to the non-inversion input terminal (plus terminal) of the calculation amplifier 111. Accordingly, in the normal operation mode and in the resonator characteristic measurement mode, an output voltage VB of the AFC circuit generated based on the voltage of the VC terminal is applied to the cathode terminal of the varactor 37 as a voltage VAFC, and the oscillation frequency is controlled.

In addition, in the temperature compensation adjustment mode, the three-terminal switch 13 enters the second state in which the second terminal and the third terminal are electrically connected to each other, and the output voltage VS (an example of the voltage other than the voltage which is input from the first terminal) of the voltage generation circuit 12 is input to the non-inversion input terminal (plus terminal) of the calculation amplifier 111. In addition, in the temperature compensation adjustment mode, since the three-terminal switch 51 enters the second state in which the first terminal and the second terminal are electrically connected to each other, the output voltage VB of the AFC circuit generated based on the constant voltage VS generated (selected) by the voltage generation circuit 12 is applied to the cathode terminal of the varactor 37 as a voltage VAFC.

The oscillator 1 of the third embodiment is configured so that by selecting the voltage VS so that a voltage which is applied to the cathode terminal of the varactor 37 in the temperature compensation adjustment mode is the closest to a voltage which is applied to the cathode terminal of the varactor 37 when the voltage of the VC terminal is a center voltage in the normal operation mode, optimum temperature compensation adjustment can be performed.

Since a flowchart of an oscillator manufacturing method of the third embodiment is similar to that of the first embodiment (FIGS. 5 and 6), it will not be shown and the description thereof will be omitted.

However, in the third embodiment, in the temperature compensation adjustment mode, a voltage follower is constituted by the calculation amplifier 111 and the variable resistance 113 and an output voltage of the calculation amplifier 111 is equal to the voltage VS, and thus in Step S51 of FIG. 6, a center voltage of the VC terminal in the normal operation mode is regarded as the voltage VAFC_IN, and a value selected so that the voltage VS is the closest to a voltage VA calculated through the expression (1) is written to the memory 61. For example, when V1=0.9 V and R2/R1=0.5 are set, a value selected so that the voltage VS is the closest to 0.9 V is written when the center voltage of the VC terminal in the normal operation mode is 0.9 V, and a value selected so that the voltage VS is the closest to 0.75 V is written when the center voltage of the VC terminal in the normal operation mode is 1.2 V.

As described above, according to the oscillator of the third embodiment, the temperature compensation characteristics can be adjusted in a state in which the output voltage of the voltage generation circuit 12 is set to a voltage closest to the output voltage VA of the calculation amplifier 111 when the center voltage is applied to the VC terminal during normal operation. Accordingly, in a state in which the voltage which is applied to the varactor 37 is the closest to the voltage which is applied to the varactor 37 when the center voltage is applied to the VC terminal during normal operation, that is, in a state in which the capacity value of the varactor 37 almost matches the capacity value when the center voltage is applied to the VC terminal during normal operation, the temperature compensation characteristics can be adjusted, and thus it is possible to reduce errors in the adjustment of the temperature compensation characteristics. Therefore, according to this embodiment, an oscillator having good frequency temperature characteristics can be provided.

Modification Example

In the oscillator 1 of the third embodiment shown in FIG. 9, in the normal operation mode and in the resonator characteristic measurement mode (a state in which the VC terminal and the AFC circuit 11 are electrically connected to each other, and the AFC circuit 11 and the circuit 30 for oscillation are electrically connected to each other), the three-terminal switch 13 enters the first state in which the first terminal and the third terminal are electrically connected to each other, and the voltage generation circuit 12 does not function since the output terminal is open. Accordingly, in the normal operation mode and in the resonator characteristic measurement mode, the selected value stored in the memory 61 has no influence on the operation of the oscillation circuit 2. In the temperature compensation adjustment mode, since the three-terminal switch 51 enters the second state in which the first terminal and the second terminal are electrically connected to each other, the calculation amplifier 111 and the variable resistance 113 function as a voltage follower, and the output voltage VA of the calculation amplifier 111 becomes equal to the output voltage VS of the voltage generation circuit 12 regardless of the resistance value R2 of the variable resistance 113. Accordingly, in the temperature compensation adjustment mode, the gain adjustment value stored in the memory 62 has no influence on the operation of the oscillation circuit 2.

Similarly to the above-described modification example of the first embodiment, the oscillator 1 of the third embodiment may be modified so that the region where a selected value (an example of the second data) for selecting which one of the n two-terminal switches 122-1 to 122-n is to be turned on is stored, and the region where a gain adjustment value (an example of the first data) of the AFC circuit 11 is stored are made to be shared. That is, in this modification example, the memory 61 existing in FIG. 9 does not exist, and in the memory 62, an address of the gain adjustment value of the AFC circuit 11 and an address of the selected value for the two-terminal switches 122-1 to 122-n are made to be shared, and a storage region corresponding to the address is used in common.

In the normal operation mode and in the resonator characteristic measurement mode, the output voltage VAFC of the variable capacity control circuit 10 becomes an output voltage of the AFC circuit 11 based on the voltage of the VC terminal, and thus a value stored in a predetermined storage region of the memory 62 is used as a gain adjustment value of the AFC circuit 11.

In addition, in the temperature compensation adjustment mode, the output voltage VAFC of the variable capacity control circuit 10 becomes a voltage based on the output voltage VS of the voltage generation circuit 12, and thus a value stored in a predetermined storage region of the memory 62 is used as a selected value for the two-terminal switches 122-1 to 122-n.

According to the oscillator 1 of this modification example, since the memory 62 is used also as the memory for storing the selected value for the two-terminal switches 122-1 to 122-n and as the memory for storing the gain adjustment value of the AFC circuit 11, this oscillator is advantageous for size reduction. The oscillator 1 of this modification example achieves similar effects to those of the oscillator 1 of the third embodiment.

2. Electronic Device

Figure 10:
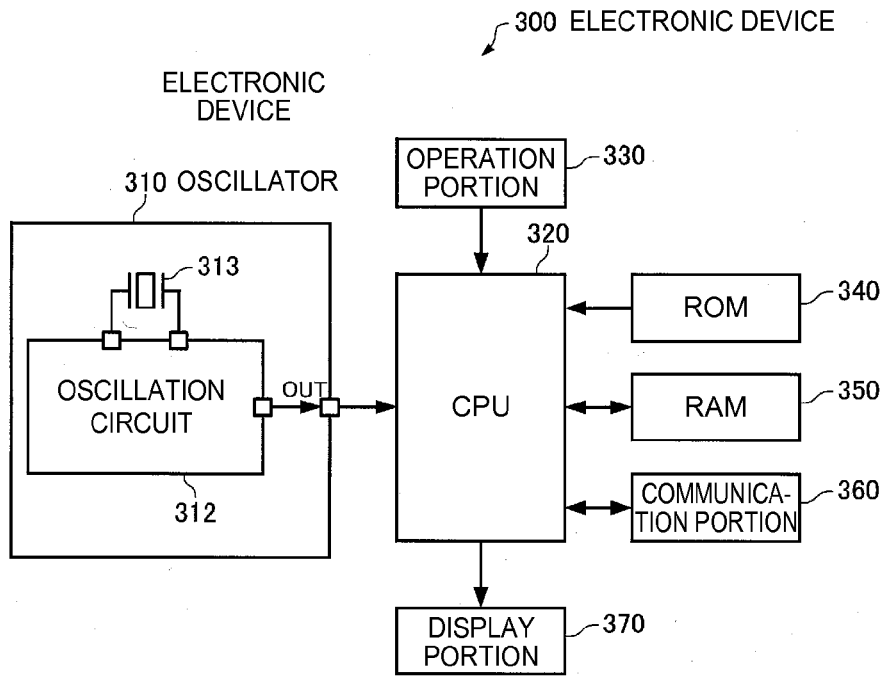
FIG. 10 is a functional block diagram of an electronic device of an embodiment.
Figure 11:
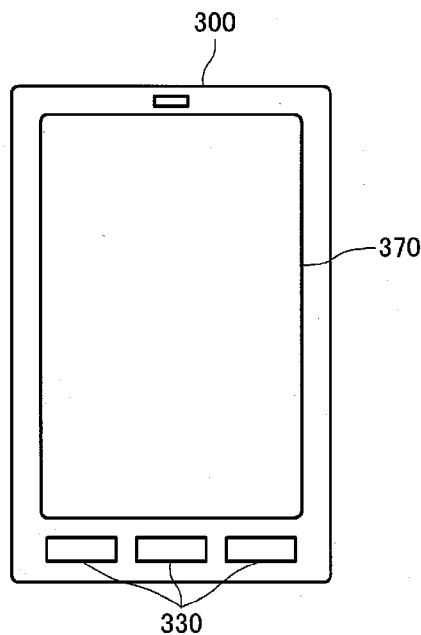
FIG. 11 is a diagram showing an example of the appearance of the electronic device of the embodiment.

FIG. 10 is a functional block diagram of an electronic device of an embodiment. FIG. 11 is a diagram showing an example of the appearance of a smart phone which is an example of the electronic device of this embodiment.

An electronic device 300 of this embodiment includes an oscillator 310, a central processing unit (CPU) 320, an operation portion 330, a read only memory (ROM) 340, a random access memory (RAM) 350, a communication portion 360, and a display portion 370. The electronic device of this embodiment may have a configuration in which some of the constituent elements (respective portions) of FIG. 10 are omitted or changed, or other constituent elements are added.

The oscillator 310 is provided with an oscillation circuit 312 and a resonator 313. The oscillation circuit 312 oscillates the resonator 313 to generate a clock signal. This clock signal is output to the CPU 320 from an OUT terminal of the oscillator 310.

The CPU 320 performs various calculation processes and control processes in synchronization with the clock signal input from the oscillator 310 according to a program stored in the ROM 340 or the like. Specifically, the CPU 320 performs various processes according to an operation signal from the operation portion 330, a process of controlling the communication portion 360 to perform data communication with an external device, a process of transmitting a display signal for displaying various information items on the display portion 370, and the like.

The operation portion 330 is an input device composed of an operation key, a button switch and the like, and outputs an operation signal according to a user's operation to the CPU 320.

The ROM 340 stores programs and data by which the CPU 320 performs various calculation processes and control processes.

The RAM 350 is used as a work area of the CPU 320, and temporarily stores a program and data read from the ROM 340, data input from the operation portion 330, results of calculation executed by the CPU 320 in accordance with various programs, and the like.

The communication portion 360 performs various controls to establish data communication between the CPU 320 and an external device.

The display portion 370 is a display device composed of a liquid crystal display (LCD) or the like, and displays various information items based on the display signal input from the CPU 320. The display portion 370 may be provided with a touch panel functioning as the operation portion 330.

An electronic device having high reliability can be realized by applying, for example, the above-described oscillation circuit 2 of each embodiment as the oscillation circuit 312, or the above-described oscillator 1 of each embodiment as the oscillator 310.

Various electronic devices are considered as the electronic device 300, and examples thereof include personal computers (for example, mobile personal computers, laptop personal computers, and tablet personal computers), mobile terminals such as smart phones and cell phones, digital still cameras, ink jet discharge devices (for example, ink jet printers), storage area network devices such as routers and switches, local area network devices, devices for base stations of mobile terminals, televisions, video cameras, video recorders, car navigation devices, real-time clock devices, pagers, personal organizers (including personal organizers with a communication function), electronic dictionaries, electronic calculators, electronic game devices, game controllers, word processors, work stations, TV phones, television monitors for security, electronic binoculars, POS terminals, medical devices (for example, electronic thermometers, sphygmomanometers, blood glucose meters, electrocardiogram measuring systems, ultrasonic diagnosis apparatuses, and electronic endoscopes), fishfinders, various kinds of measuring devices, instruments (for example, instruments for vehicles, aircraft, rockets, or ships), flight simulators, head-mounted displays, motion tracing devices, motion tracking devices, motion controllers, and pedestrian location and direction measurement (PDR) devices.

3. Mobile Object

Figure 12:
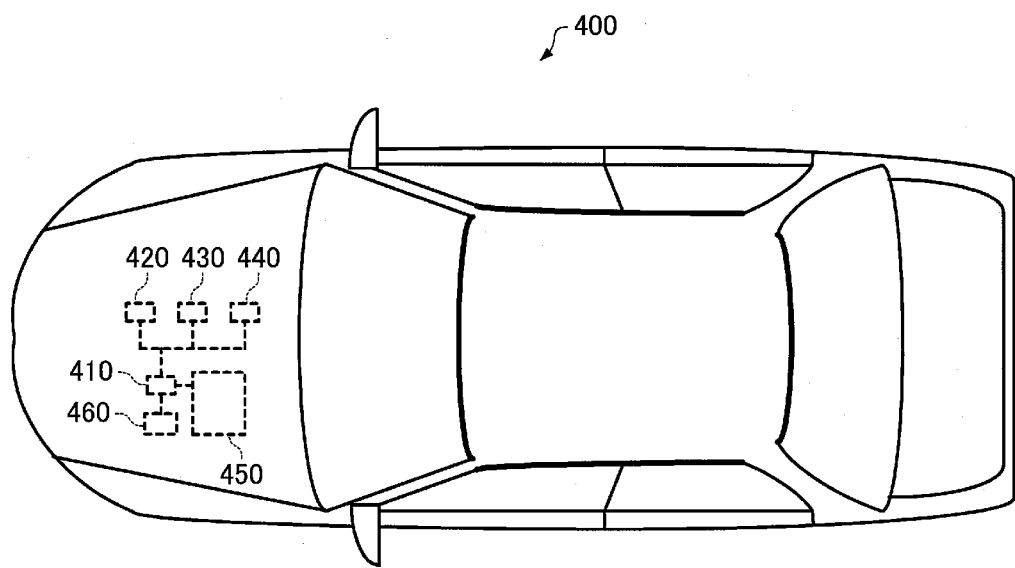
FIG. 12 is a diagram showing an example of a mobile object of an embodiment.

FIG. 12 is a diagram (top view) showing an example of a mobile object of an embodiment. A mobile object 400 shown in FIG. 12 includes an oscillator 410, controllers 420, 430, and 440 which perform various controls of an engine system, a braking system, a keyless entry system, and the like, a battery 450, and a backup battery 460. The mobile object of this embodiment may have a configuration in which some of the constituent elements (respective portions) of FIG. 12 are omitted, or other constituent elements are added.

The oscillator 410 is provided with an oscillation circuit and a resonator (not shown), and the oscillation circuit oscillates the resonator to generate a clock signal. This clock signal is output to the controllers 420, 430, and 440 from an external terminal of the oscillator 410.

The battery 450 supplies electric power to the oscillator 410 and the controllers 420, 430, and 440. The backup battery 460 supplies electric power to the oscillator 410 and the controllers 420, 430, and 440 when an output voltage of the battery 450 is lower than a threshold.

A mobile object having high reliability can be realized by applying, for example, the above-described oscillation circuit 2 of each embodiment as the oscillation circuit provided to the oscillator 410, or the above-described oscillator 1 of each embodiment as the oscillator 410.

Various mobile objects are considered as the mobile object 400, and examples thereof include automobiles (including electric automobiles), aircrafts such as jet aircrafts and helicopters, ships, rockets, and satellites.

The invention is not limited to the embodiments, and various modifications can be made within the scope of the gist of the invention.

The above-described embodiments and modification examples are only examples, and the invention is not limited thereto. For example, the embodiments and the modifications can be appropriately combined with each other.

The invention includes substantially the same configurations (for example, configurations having the same functions, methods and results, or configurations having the same objects and effects) as those described in the embodiments. The invention also includes configurations in which portions which are not essential in the configurations described in the embodiments are replaced. The invention also includes configurations achieving the same operational effects as those of the configurations described in the embodiments, or configurations capable of achieving the same object. The invention also includes configurations in which known techniques are added to the configurations described in the embodiments.

The entire disclosure of Japanese Patent Application No. 2013-231420, filed Nov. 7, 2013 is expressly incorporated by reference herein.

What is claimed is:

1. An oscillation circuit comprising:
   a frequency controller;
   a capacity controller which can variably set a voltage to be output therefrom;
   an oscillation unit which has a capacity variation unit and to which a voltage from the frequency controller and a voltage from the capacity controller are input; and
   a first selection unit to which a voltage from a voltage control terminal is input and which selects whether or not to output the voltage from the voltage control terminal to the capacity controller,
   wherein the capacity controller is controlled based on either the voltage from the voltage control terminal or a voltage other than the voltage from the voltage control terminal.

2. An oscillation circuit comprising:
   a first terminal;
   a circuit for oscillation which is provided with a variable capacity element;
   a circuit for frequency adjustment which is electrically connected to the circuit for oscillation;
   a variable capacity control circuit which is electrically connected to one terminal of the variable capacity element; and
   a first switching portion which controls the electrical connection between the first terminal and the variable capacity control circuit,
   wherein a voltage which is output from the variable capacity control circuit is controlled based on either a voltage which is input from the first terminal or a voltage other than the voltage which is input from the first terminal.

3. The oscillation circuit according to claim 2,
   wherein the first switching portion is controlled so as to cut the electrical connection between the first terminal and the variable capacity control circuit, and
   wherein in the variable capacity control circuit, the voltage which is output therefrom is controlled with the voltage other than the voltage which is input from the first terminal.

4. The oscillation circuit according to claim 2,
   wherein the first switching portion is controlled so that the first terminal and either the circuit for frequency adjustment or the variable capacity control circuit are electrically connected to each other.

5. The oscillation circuit according to claim 2,
   wherein the variable capacity control circuit is provided with an AFC circuit, a voltage generation circuit which can variably set a voltage to be output therefrom, and a second switching portion which controls the electrical connection between the AFC circuit and the voltage generation circuit.

6. The oscillation circuit according to claim 2,
   wherein the variable capacity control circuit is provided with an AFC circuit, a voltage generation circuit which can variably set a voltage to be output therefrom, and a second switching portion which controls the electrical connection between the one terminal of the variable capacity element and either the AFC circuit or the voltage generation circuit.

7. The oscillation circuit according to claim 2, further comprising:
   a memory in which data for controlling the voltage which is output from the variable capacity control circuit is stored.

8. The oscillation circuit according to claim 3, further comprising:
   a memory in which data for controlling the voltage which is output from the variable capacity control circuit is stored.

9. The oscillation circuit according to claim 4, further comprising:
   a memory in which data for controlling the voltage which is output from the variable capacity control circuit is stored.

10. The oscillation circuit according to claim 5, further comprising:
    a memory in which data for controlling the voltage which is output from the variable capacity control circuit is stored,
    wherein in the memory, first data for controlling the AFC circuit and second data for controlling the voltage generation circuit are stored to use a storage region where the first data and the second data are stored in common.

11. The oscillation circuit according to claim 6, further comprising:
   a memory in which data for controlling the voltage which is output from the variable capacity control circuit is stored,
   wherein in the memory, first data for controlling the AFC circuit and second data for controlling the voltage generation circuit are stored, and a storage region where the first data and the second data are stored is used in common.

12. The oscillation circuit according to claim 7,
   wherein the data for controlling the variable capacity control circuit is composed of three or more bits.

13. The oscillation circuit according to claim 10,
   wherein the data for controlling the variable capacity control circuit is composed of three or more bits.

14. An oscillator comprising:
   the oscillation circuit according to claim 2; and
   a resonator.

15. An electronic device comprising:
   the oscillation circuit according to claim 2.

16. An electronic device comprising:
   the oscillator according to claim 14.

17. A mobile object comprising:
   the oscillation circuit according to claim 2.

18. A mobile object comprising:
   the oscillator according to claim 14.

19. An oscillator manufacturing method comprising:
   preparing a resonator and an oscillation circuit including a first terminal, a circuit for oscillation which is provided with a variable capacity element, a circuit for frequency adjustment which is electrically connected to the circuit for oscillation, a variable capacity control circuit which is electrically connected to one terminal of the variable capacity element, and a first switching portion which controls the electrical connection between the first terminal and the variable capacity control circuit, a voltage which is output from the variable capacity control circuit being controlled based on either a voltage which is input from the first terminal or a voltage other than the voltage which is input from the first terminal;
   electrically connecting the oscillation circuit and the resonator to each other;
   controlling the first switching portion so as to electrically disconnect the first terminal and the variable capacity control circuit from each other, and controlling the voltage which is output from the variable capacity control circuit with the voltage other than the voltage which is input from the first terminal; and
   examining characteristics of the oscillation circuit.

* * * * *